United States Patent [19]

Yokoyama

[11] Patent Number: 4,724,398

[45] Date of Patent: Feb. 9, 1988

[54] GAIN-CONTROLLED AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 921,948

[22] Filed: Oct. 22, 1986

[30] Foreign Application Priority Data

Oct. 29, 1985 [JP] Japan .................. 60-241900

[51] Int. Cl.⁴ ............................. H03G 3/18
[52] U.S. Cl. ..................... 330/278; 330/254; 330/285
[58] Field of Search .............. 330/254, 278, 279, 285, 330/288

[56] References Cited

U.S. PATENT DOCUMENTS 4,437,070  3/1984  Hori .................. 330/254

Primary Examiner—Gene Wan
Attorney, Agent, or Firm—Darby & Darby

[57] ABSTRACT

A gain-controlled amplifier amplifies with reduced distortion an input signal at a gain which varies exponentially in accordance with a control voltage, and has a wide dynamic range irrespectively of the value of the control voltage. The gain-controlled amplifier comprises first and second operational amplifiers, first and second transistor pairs, a bias current control circuit and a subtracting circuit. The first transistor pair comprises emitter-coupled first and second transistors of the same conduction type (PNP or NPN), and the second transistor pair comprises emitter-coupled third and fourth transistors of the same conduction type as the first and second transistors. The common emitters of the first and second transistor pairs are connected to output terminals of the first and second operational amplifiers, respectively. Non-inverting input terminals of the first and second operational amplifiers are grounded. Collectors of the first and third transistors are connected to the inverting input terminals of the first and second operational amplifiers, respectively. The input signal and an inversion thereof are supplied to the inverting input terminals of the first and second operational amplifiers, respectively. The control voltage is supplied between bases of each of the first and second transistor pairs. The bias current control circuit generates currents which vary exponentially in accordance with the control voltage, and supplies the currents to the inverting input terminals of the first and second operational amplifiers. The subtracting circuit subtracts a signal at the collector of the second transistor from a signal at the collector of the fourth transistor and outputs the subtraction result as an output signal of the gain-controlled amplifier.

7 Claims, 6 Drawing Figures

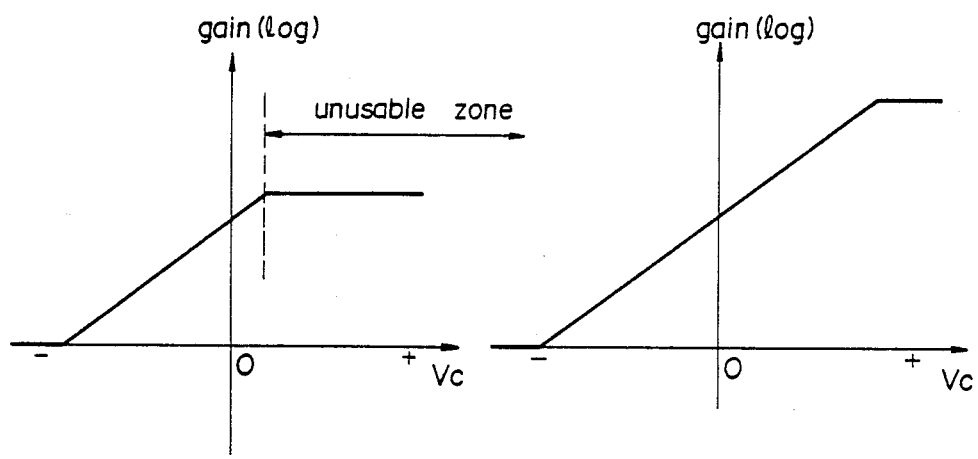

GAIN-CONTROLLED AMPLIFIER

BACKGROUND OF THE INVENTION

(a) FIELD OF THE INVENTION

The present invention relates to a gain-controlled amplifier whose gain varies exponentially in response to a linear voltage variation of a control voltage applied to the amplifier.

(b) DESCRIPTION OF THE PRIOR ART

FIG. 1 shows one conventional gain-controlled amplifier of the type in which bipolar transistors of different conduction type are utilized. In FIG. 1, reference numeral 1 denotes a bipolar transistor pair which comprises two PNP transistors, reference numeral 2 denotes a transistor pair which comprises two NPN transistors, and 3 and 4 denote operational amplifiers, respectively. The gain of the amplifier shown in FIG. 1 varies exponentially in response to a linear voltage variation of a control voltage Vc applied to the amplifier. The principle of operation of the above-described amplifier will be described.

With the arrangement of the circuit of the amplifier, the following equations are obtained:

$$i_i = Vi/Ri \quad (1a)$$

$$i_o = Vo/Ro \quad (1b)$$

$$i_i + i_1 = i_4 \quad (1c)$$

$$i_2 = i_o + i_3 \quad (1d)$$

$$V_2 = V_1 - VB \quad (1e)$$

From the characteristics of p-n junction of semiconductor, the following equations are obtained when a saturation current of each p-n junction is expressed as $i_s$:

$$i_1 = i_s \exp\{(q/kT) \cdot V_1\} \quad (2a)$$

$$i_2 = i_s \exp\{(q/kT) \cdot (V_1 - Vc)\} \quad (2b)$$

$$i_3 = i_s \exp\{(q/kT) \cdot V_2\} \quad (2c)$$

$$i_4 = i_s \exp\{(q/kT) \cdot (V_2 + Vc)\} \quad (2d)$$

where,
q: an electric charge of an electron
k: Boltzmann's constant
T: the junction temperature in absolute temperature.

A voltage gain Vo/Vi of this amplifier is obtained by simplifying the above mentioned equations as follows:

$$Vo/Vi = (-Ro/Ri) \exp\{(q/kT) \cdot Vc\} \quad (3)$$

It will be understood from the equation (3) that the voltage gain varies exponentially in response to a linear voltage variation of the control voltage Vc applied to the amplifier.

However, the gain-controlled amplifier shown in FIG. 1 has a problem that the distortion generated therein is large because the amplifier utilizes the transistor pairs of different conduction types and the characteristics of the PNP transistors and NPN transistors are different from each other.

To solve the above-mentioned problem, an amplifier which utilizes transistor pairs of the same conduction type has been developed.

FIG. 2 shows the circuit of one of such gain-controlled amplifiers.

In FIG. 2, reference numerals 6 and 7 denote input terminals to which input signals (Vi and −Vi) opposite in phase to each other are applied, and those input terminals 6 and 7 are connected to inverting input terminals of operational amplifiers 10 and 11 through resistors 8 and 9 (values are both Ri), respectively. Reference numeral 12 denotes a transistor pair which comprises NPN transistors 12a and 12b of which emitters are connected to each other. Similarly, reference numeral 13 denotes a transistor pair which comprises NPN transistors 13a and 13b of which emitters are connected to each other. And, the common emitters of both transistor pairs 12 and 13 are connected to output terminals of the operational amplifiers 10 and 11, respectively. A collector of the transistor 12a is connected to an output terminal of a constant current supply 14 (value is IB) and the inverting input terminal of the operational amplifier 10, and the base of the transistor 12a is connected to the ground. A collector of the transistor 13a is connected to an output terminal of a constant current supply 15 (value is IB) and the inverting input terminal of the operational amplifier 11, and the base of the transistor 13a is connected to the ground. Reference numeral 16 denotes a variable voltage supply for outputting a control voltage Vc, and the control voltage Vc is supplied to bases of the transistors 12b and 13b. Reference numeral 17 denotes a current-to-voltage converter which comprises a resistor 18 (value is RL) and an operational amplifire 19, and reference numeral 20 denotes a circuit of a current-to-voltage converter which comprises a resistor 21 (value is RL) and an operational amplifier 22. The current-to-voltage converters 17 and 20 convert collector currents of the transistors 12b and 13b to voltage signals. Reference numeral 25 denotes a subtraction circuit which comprises resistors 26 to 29 (values are all R) and an operational amplifier 30. The subtraction circuit 25 subtracts the output signal of the current-to-voltage converter 17 from that of the current-to-voltage converter 20, and outputs the subtraction result as an output signal Vo.

The operation of the above-mentioned circuit will now be explained. With the arrangement of the circuit, when currents $i_1$ to $i_4$ flow as shown in FIG. 2, the following equations are obtained from the characteristics of the P-N junction:

$$i_1 = Vi/Ri + IB \quad (4a)$$

$$i_2 = i_1 \cdot \exp(K \cdot Vc) \quad (4b)$$

$$i_3 = IB - Vi/Ri \quad (4c)$$

$$i_4 = i_3 \cdot \exp(K \cdot Vc) \quad (4d)$$

where, $K = q/kT$.

On the other hand, the output voltage $V_0$ of the circuit can be expressed by the following equation:

$$Vo = i_4 \cdot RL - i_2 \cdot RL \quad (5)$$

And therefore, the output voltage Vo can be expressed by the following equation by substituting the above-mentioned equations (4a) to (4d) for this equation (5)

$$Vo = i_3 \cdot \exp(K \cdot Vc) - i_1 \cdot \exp(K \cdot Vc) = (-2Vi/Ri) \cdot \exp(K \cdot Vc) \quad (6)$$

The voltage gain (Vo/Vi) of the circuit shown in FIG. 2 is obtained by transforming the equation (6) as follows:

$$(Vo/Vi) = (-2/Ri) \cdot \exp(K \cdot Vc) \quad (7)$$

This equation (7) shows that the voltage gain is controlled by the control voltage Vc in the above-mentioned circuit.

However, the circuit shown in FIG. 2 has a deficiency as described hereunder.

A bias voltage Va at a point a in the circuit shown in FIG. 2 will first be examined. When the input signal Vi is 0, the current $i_2$ is expressed as follows from the above-mentioned equations (4a) and (4b):

$$i_2 = IB \cdot \exp(K \cdot Vc) \quad (8)$$

Therefore, the voltage Va at the point a can be expressed by the following equation (9):

$$Va = i_2 \cdot RL = IB \cdot \exp(K \cdot Vc) \cdot RL \quad (9)$$

A voltage Vb at a point b in the above-mentioned circuit can be also obtained in a manner described above for the voltage Va and is expressed by the following equation:

$$Va = IB \cdot \exp(K \cdot Vc) \cdot RL \quad (10)$$

It will be understood from the above equations (9) and (10) that the biases at the point a and the point b depend on the control voltage Vc. When the control voltage Vc is made larger to render the gain larger in the conventional gain-controlled circuit shown in FIG. 2, the potentials at the point a and the point b increase, so that the operational amplifiers 19 and 22 are liable to saturate. Therefore, in such condition, the dynamic range of the amplifier becomes smaller, so that the maximum amplitude of the input signal Vi is limited significantly.

The conventional gain-controlled amplifier shown in FIG. 2, thus has a reduced distortion due to the utilization of the transistor pairs of the same conduction-type transistors, but, on the other hand, the amplifier has a deficiency that the dynamic range thereof becomes smaller when the control voltage Vc is made greater to render the gain higher.

SUMMARY OF THE INVENTION

It is therefore an object of the present invention to provide a gain-controlled amplifier which can operate with reduced distortion and has a dynamic range which does not become smaller even when the control voltage is high.

According to an aspect of the present invention, there is provided a gain-controlled amplifier for amplifying an input signal at a gain which is controlled by a control voltage applied thereto comprising a first operational amplifier having an inverting input terminal to which the input signal is applied and a non-inverting input terminal which is grounded; a second operational amplifier having an inverting input terminal to which an inversion of the input signal is applied and a non-inverting input terminal which is grounded; a first transistor pair having first and second transistors of the same conduction type of which emitters are connected to each other, the emitters of the first and second transistors being connected to an output terminal of the first operational amplifier, a collector of the first transistor being connected to the inverting input terminal of the first operational amplifier, the control voltage being applied between bases of the first and second transistors; a second transistor pair having third and fourth transistors of the same conduction type as the first and second transistors, emitters of the third and fourth transistors being connected to each other, the emitters of the third and fourth transistors being connected to an output terminal of the second operational amplifier, a collector of the third transistor being connected to the inverting input terminal of the second operational amplifier, the control voltage being applied between bases of the third and fourth transistors; a subtracting circuit for subtracting an output signal from a collector of the fourth transistor from an output signal from a collector of the second transistor to produce an output of the gain-controlled amplifier; and a bias current control circuit for supplying constant currents, which vary exponentially in response to linear voltage change of the control voltage, respectively to the inverting input terminals of the first and second operational amplifiers.

BRIEF DESCRIPTION OF THE DRAWINGS

FIG. 4 is an illustration showing a characteristic of the prior art gain-controlled amplifier shown in FIG. 1;

FIG. 5 is an illustration showing a characteristic of the gain-controlled amplifier of the embodiment shown in FIG. 3;

DESCRIPTION OF THE PREFERRED EMBODIMENT OF THE INVENTION

Figure 1:
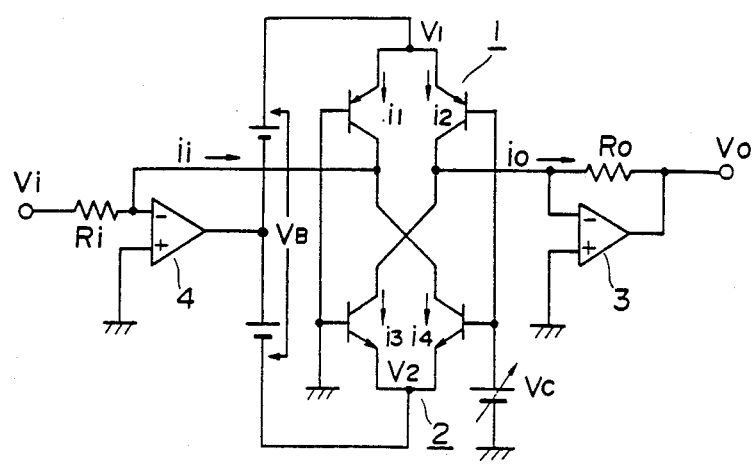
FIG. 1 is a schematic circuit diagram of a prior art gain-controlled amplifier.
Figure 2:
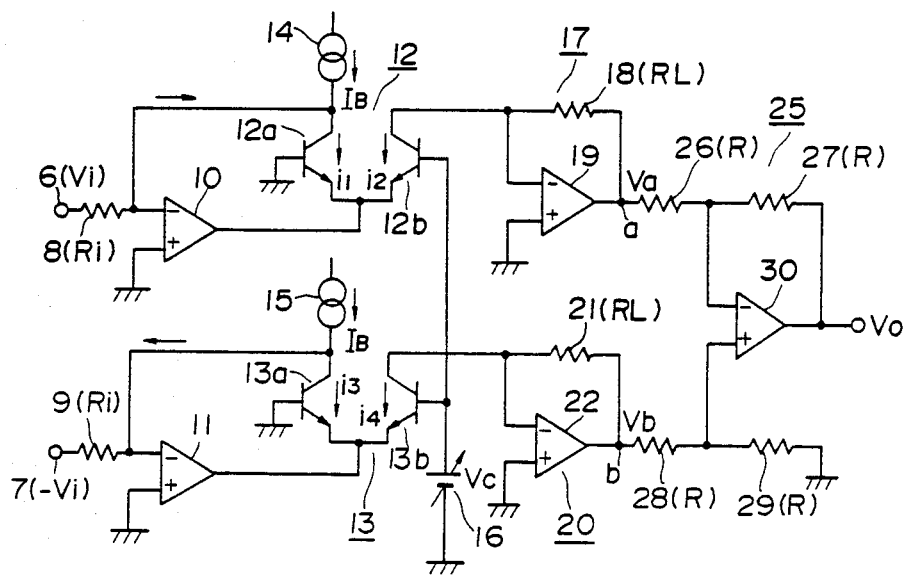
FIG. 2 is a schematic circuit diagram of another prior art gain-controlled amplifier.
Figure 3:
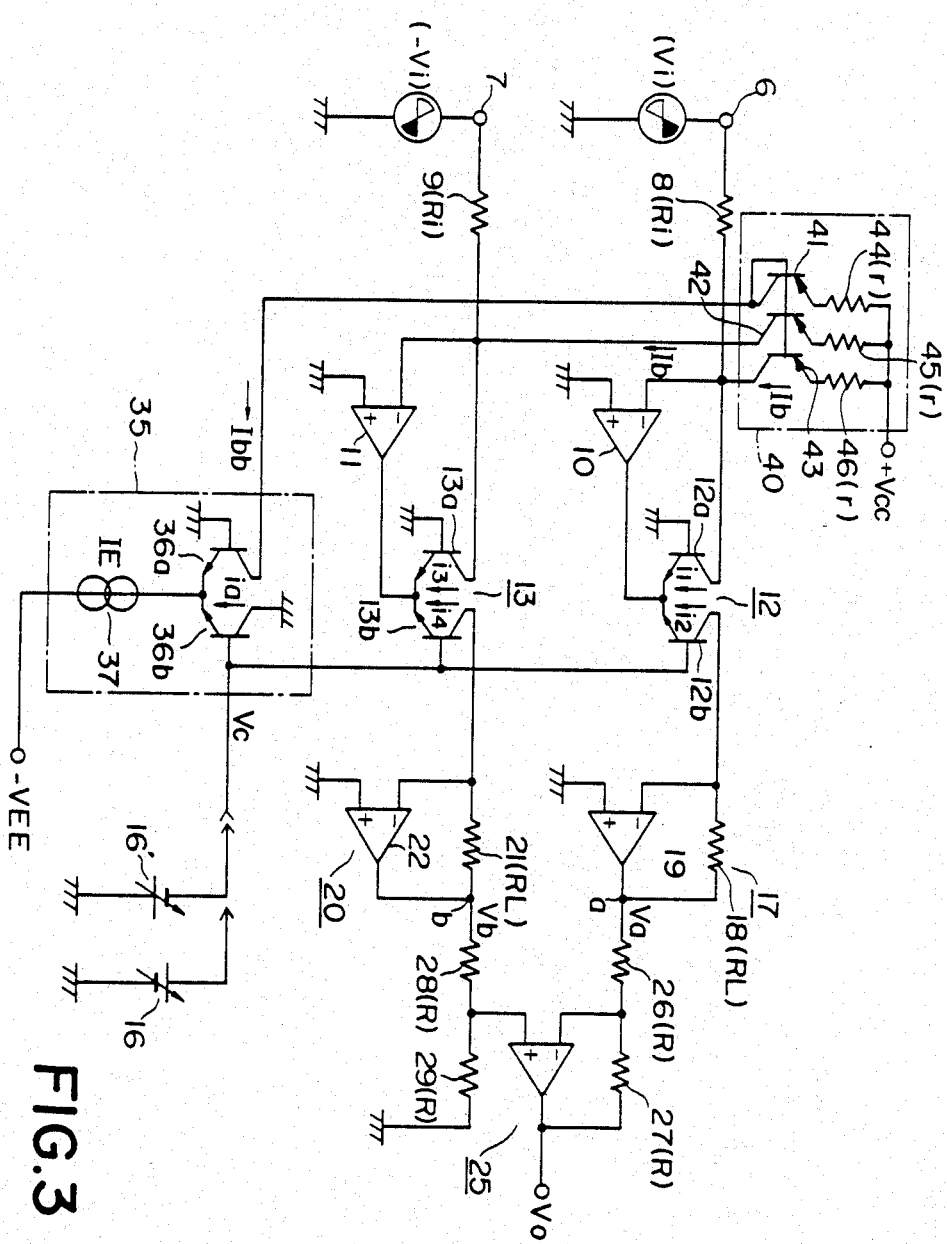
FIG. 3 is a schematic circuit diagram of a gain-controlled amplifier according to an embodiment of the present invention.

FIG. 3 shows a circuit diagram of a gain-controlled amplifier according to one embodiment of the present invention, wherein like reference numerals denote the corresponding parts of the amplifier shown in FIG. 2.

A constant current supply 35 outputs an output current Ibb which varies exponentially in response to a linear voltage change of a control voltage Vc applied thereto. This constant current supply 35 includes two NPN transistors 36a and 36b, of which emitters are connected to each other, and a constant current supply 37 (current is IE). The base of the transistor 36a is grounded, and the control voltage Vc is supplied to the base of the transistor 36b.

A current-mirror circuit 40 includes a transistor 41 whose collector and base are connected to each other, transistors 42 and 43 whose bases are connected to the base of the transistor 41, and emitter resistors 44, 45, and 46 (values are all r) of the transistors 41 to 43. The collector of the transistor 41 is connected to the collector of the transistor 36a. Therefore, output currents Ib of the transistors 42 and 43 are equal in amount to the current Ibb as shown in FIG. 3. Reference numeral 16' denotes a variable voltage supply which is used when an inversion of the control voltage Vc is needed.

The operation of the embodiment thus constructed will now be described. Considering the construction of the circuit of the amplifier and a characteristic of p-n junction of a transistor, it may be understood that the amplifier of this embodiment has the same gain as the amplifier shown in FIG. 2, the gain being expressed by the equation (7). The relation between the voltage gain and the control voltage Vc of this embodiment is the same as that of the amplifier shown in FIG. 2.

Description as to the bias at a point a of the circuit of this embodiment will now be given. When the current which flows from the collector to the emitter of the transistor 36b is ia, the following formulas are obtained:

$$ia = Ibb \cdot \exp(K \cdot Vc) \quad (10a)$$

$$ia = IE - Ibb \quad (10b)$$

The following formula is also derived from the above formulas (10a) and (10b):

$$Ibb = IE/\{1 + \exp(K \cdot Vc)\} \quad (11)$$

This formula (11) can be converted to the following formula, when $K \cdot VC >> 1$ is established in the formula (11):

$$Ibb = IE/\exp(K \cdot Vc) \quad (12)$$

On the other hand, the current $i_2$ is expressed by the following formula:

$$i_2 = Ib \cdot \exp(K \cdot Vc) \quad (13)$$

And, as $Ibb = Ib$ is established, the voltage Va at the point a of the amplifier can be expressed by:

$$Va = RL \cdot i_2 = RL \cdot Ib \cdot \exp(K \cdot Vc) \quad (14)$$
$$= RL \cdot \{IE/\exp(K \cdot Vc)\} \cdot \exp(K \cdot Vc)$$
$$= RL \cdot IE$$

The bias voltage Va at the point a of this embodiment is constant irrespectively of the control voltage Vc, because both RL and IE on the right side of this formula (14) are constant. And, it can be indicated by the same method as mentioned above that the bias voltage Vb at the point b is constant irrespectively of the control voltage Vc.

Therefore, the bias voltages at the points a and b of this embodiment are constant irrespectively of the control voltage Vc once the bias voltages are set to appropriate values by properly determining the value of the resistor RL and the value of the current IE. As a result, the operational amplifiers 19 and 22 will not saturate even when the value of the control voltage Vc is great, so that the dynamic range of the amplifier is kept wide.

The relation between the control voltage Vc and the gain of the conventional amplifier of FIG. 2 is shown in FIG. 4, and the relation between the control voltage Vc and the gain of the amplifier of this embodiment is shown in FIG. 5. From these relations, it will be understood that the gain of the amplifier shown in FIG. 2 sturates due to saturations of the operational amplifiers 19 and 22 when the control voltage becomes more than a certain value, and that the gain of the amplifier of this embodiment does not saturate even when the control voltage Vc becomes more than the certain value.

Figure 6:
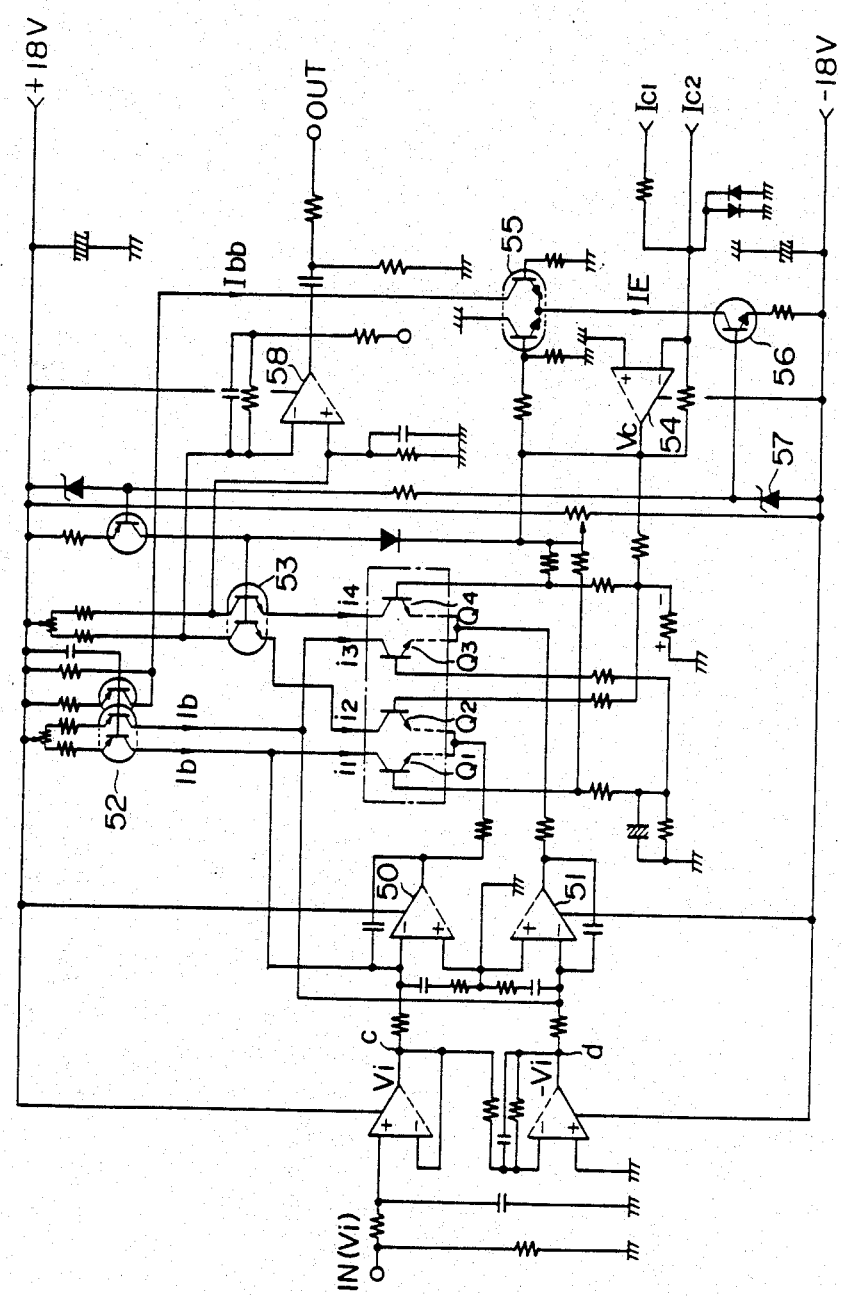
FIG. 6 is a specific schematic circuit diagram of a gain controlled-amplifier of the embodiment shown in FIG. 3.

A specific circuit diagram of the embodiment shown in FIG. 3 is shown in FIG. 6. In FIG. 6, like reference numerals denote parts corresponding to those of the circuit shown in FIG. 3.

The operation of this circuit is the same as that of the amplifier shown in FIG. 3, and therefore description as to the operation of this circuit is omitted. And, only the relation between each of the circuit portions of the amplifier shown in FIG. 3 and a corresponding one of the circuit portions of the amplifier of FIG. 6 will be described. The points c and d of the amplifier shown in FIG. 6 are input points corresponding to the input terminals 6 and 7 of the amplifier shown in FIG. 3, and the input signals Vi and −Vi which are opposite in phase to each other are applied to these input points. The operational amplifiers 50 and 51 in FIG. 6 correspond to the operational amplifiers 10 and 11 in FIG. 3, and the transistors Q1, Q2, Q3 and Q4 of the amplifier shown in FIG. 6 correspond to the transistors 12a, 12b, 13a, and 13b of the amplifier shown in FIG. 3, respectively. The current-mirror circuit 52 corresponds to the current-mirror circuit 40 of the amplifier shown in FIG. 3, and outputs currents Ib and Ib each of which is set to a certain value proportional to the current Ibb. The transistor pair 53 of a grounded-base connection corresponds to the current-to-voltage converters 17 and 20 of the amplifier shown in FIG. 3. The transistor pair 53 outputs voltages corresponding respectively to the currents $i_2$ and $i_4$. With such construction wherein the current-to-voltage conversion is performed by transistors whose bases are grounded, an advantage that the operation speed is high can be obtained. The operational amplifier 54 converts control currents $Ic_1$ and $Ic_2$ to the control voltage Vc, and the transistor pair 55, which corresponds to the transistors 36a and 36b of FIG. 3, constitutes a constant-current supply whose output current can be varied. The transistor 56 and the zener diode 57 constitute a constant-current supply corresponding to the constant-current supply 37. The operational amplifier 58 constitutes a subtracting circuit corresponding to the subtracting circuit 25 of FIG. 3. The gain of this amplifier varies ideally exponentially in response to a linear voltage variation of the control voltage Vc since the electric potential of the bases of the transistor pair 53 is shifted in accordance with the value of the control voltage Vc to keep the $V_{VB}$ of each of the transistors $Q_2$ and $Q_4$ zero (0).

What is claimed is:
1. A gain-controlled amplifier for amplifying an input signal at a gain which is controlled by a control voltage applied thereto comprising:
   a first operational amplifier having an inverting input terminal to which the input signal is applied and a non-inverting input terminal which is grounded;
   a second operational amplifier having an inverting input terminal to which an inversion of the input signal is applied and a non-inverting input terminal which is grounded;
   a first transistor pair having first and second transistors of the same conduction type of which emitters are connected to each other, the emitters of said first and second transistors being connected to an output terminal of said first operational amplifier, a collector of said first transistor being connected to said inverting input terminal of said first operational amplifier, the control voltage being applied between bases of said first and second transistors;

a second transistor pair having third and fourth transistors of the same conduction type as said first and second transistors, emitters of said third and fourth transistors being connected to each other, the emitters of said third and fourth transistors being connected to an output terminal of said second operational amplifier, a collector of said third transistor being connected to said inverting input terminal of said second operational amplifier, the control voltage being applied between bases of said third and fourth transistors;

a subtracting circuit for subtracting an output signal from a collector of said fourth transistor from an output signal from a collector of said second transistor to produce an output of the gain-controlled amplifier; and a bias current control circuit for supplying constant currents, which vary exponentially in response to linear voltage change of the control voltage, respectively to said inverting input terminals of said first and second operational amplifiers.

2. A gain-controlled amplifier according to claim 1, wherein said bias current control circuit comprises a constant current supply whose output current varies exponentially in response to linear voltage change of the control voltage and a current-mirror circuit for being supplied with said output current of said constant current supply to output currents as said currents to said inverting input terminals of said first and second operational amplifiers.

3. A gain-controlled amplifier according to claim 2, wherein said constant current supply comprises fifth and sixth transistors whose emitters are connected to each other and a constant current circuit for causing a constant current to flow through said common emitter of said fifth and sixth transistors, a collector of said fifth transistor being grounded, a collector of said sixth transistor being connected to said current-mirror to supply said output current of said constant current supply to said current-mirror circuit, the control voltage being supplied between bases of said fifth and sixth transistors.

4. A gain-controlled amplifier according to claim 3, wherein said current-mirror circuit comprises a seventh transistor whose collector and base are connected to each other, eighth and ninth transistors whose bases are connected to said base of said seventh transistor, and resistors interposed between emitters of said seventh to ninth transistors and a voltage source, said collector of said seventh transistor being supplied with said output current of said constant current supply, collectors of said eighth and ninth transistors being connected respectively to said inverting input terminals of said first and second operational amplifiers.

5. A gain-controlled amplifier according to claim 1 further comprising current-to-voltage converting means for converting collector currents of said second and fourth transistors into first and second voltage signals, respectively, said subtracting circuit subtracting said second voltage signal from said first voltage signal to produce said output signal of the gain-controlled amplifier.

6. A gain-controlled amplifier according to claim 5, wherein said current-to-voltage converting means comprises transistors of grounded-base connection.

7. A gain-controlled amplifier according to claim 6, wherein bases of said transistors of grounded-base connection are supplied with the control voltage.

* * * * *